United States Patent [19]

Tu et al.

[11] Patent Number: 5,498,958
[45] Date of Patent: Mar. 12, 1996

[54] INDUCTIVE PROXIMITY SENSOR WITH PERIODIC SWITCHING FOR SENSING THE PRESENCE OF OBJECTS

[75] Inventors: Mai X. Tu; Michel Schwab, both of Biel-Bienne, Switzerland

[73] Assignee: Detra SA, Bienne, Switzerland

[21] Appl. No.: 145,180

[22] Filed: Nov. 3, 1993

Related U.S. Application Data

[63] Continuation-in-part of Ser. No. 808,614, Dec. 17, 1991, abandoned.

[30] Foreign Application Priority Data

Dec. 21, 1990 [EP] European Pat. Off. ............ 90811020

[51] Int. Cl.$^6$ .................. G01B 7/00; G01V 3/10; H03K 17/95
[52] U.S. Cl. ............. 324/207.16; 324/207.26; 324/239; 324/329; 324/336
[58] Field of Search .......... 324/207.15, 207.16, 324/207.17, 207.26, 233, 234, 234–240, 329, 336; 340/551, 686, 941; 307/116; 361/179, 180

[56] References Cited

U.S. PATENT DOCUMENTS

| | | | |
|---|---|---|---|
| 3,315,155 | 4/1967 | Colani | 324/239 |
| 3,395,338 | 7/1968 | Barringer | 324/336 |
| 3,707,672 | 12/1972 | Miller et al. | 324/239 |
| 4,219,740 | 8/1980 | Little | 307/116 |
| 4,276,484 | 6/1981 | Riveros | 324/334 X |
| 4,544,892 | 10/1985 | Kaufman et al. | 324/336 X |
| 4,600,356 | 7/1986 | Bridges et al. | 324/336 X |
| 4,868,504 | 9/1989 | Johnson | 324/239 X |
| 5,059,902 | 10/1991 | Linder | 324/207.17 |

FOREIGN PATENT DOCUMENTS

| | | |
|---|---|---|
| 0237171 | 9/1987 | European Pat. Off. . |
| 2040054 | 8/1980 | United Kingdom . |
| WP87/00933 | 2/1987 | WIPO . |

OTHER PUBLICATIONS

Colani, C. "A New Type of Locating Device I–The Instrument", Archaeometry, pp. 3–8, Received in U.S.P.T.O. Jan. 27, 1979.

*Primary Examiner*—Gerard R. Strecker
*Attorney, Agent, or Firm*—Oliff & Berridge

[57] ABSTRACT

An inductive proximity sensor determines if a metallic object is in close proximity. An inductor is placed near the object. Several switches control the direction of the voltage passing through the inductor. During a first time period, the voltage flows through the inductor to induce a magnetic field in the object. During the second time period, the voltage is reversed in the inductor to quickly eliminate any current in the inductor. The decaying magnetic field in the object induces a voltage in the inductor which is measured during a third time period and compared to a reference value to determine the proximity of the object to the sensor.

20 Claims, 7 Drawing Sheets

5,498,958

INDUCTIVE PROXIMITY SENSOR WITH PERIODIC SWITCHING FOR SENSING THE PRESENCE OF OBJECTS

RELATED APPLICATION

This is a Continuation-in-Part of application Ser. No. 07/808,614, filed Dec. 17, 1991, now abandoned.

BACKGROUND OF THE INVENTION

1. Field of the Invention

This invention relates to inductance measurement equipment, and more particularly to an inductive proximity sensor of the type having a coil, means for feeding the coil, and means for measuring and processing signals capable of yielding a response in the presence of an object to be detected.

2. Description of the Related Art

Inductive proximity sensors utilizing a resonant circuit have been proposed (see U.S. Pat. No. 4,219,740.) The operating principle of this type of sensor is as follows: in the absence of a metal object in proximity to the sensor, the measuring circuit in the form of a resonance-type oscillator oscillates at maximum amplitude. The proximity of a metal object causes losses through eddy currents induced in that object and consequently attenuation of the resonance amplitude. A comparison of this amplitude with a reference value therefore makes it possible to detect the presence of metal objects. The great drawback of this type of sensor is its sensitivity to internal losses of the resonant circuit (ohmic losses in the coil of the circuit, hysteretic losses in the magnetic circuit of the coil). Such losses are, in fact, dependent upon the temperature, and this is a cause of inaccuracy in the detection results.

SUMMARY OF THE INVENTION

It is an object of this invention to provide an improved inductive proximity sensor which eliminates these drawbacks.

To this end, in the inductive proximity sensor according to the present invention, of the type initially mentioned, the feeding means are arranged for supplying the coil with a periodic current of a period T, the current delivered by the feeding means to the coil flowing in the latter for a duration $T_1$ less than T and having a value of substantially zero for the remainder $(T-T_1)$ of the period, and the means for measuring and processing the signals are arranged to yield the response in the presence of the object to be detected for the aforementioned remaining duration $(T-T_1)$ of the period.

BRIEF DESCRIPTION OF THE DRAWINGS

For a better understanding of the invention and further features thereof, reference is made to the following detailed description of the invention to be read in connection with the accompanying drawings, wherein.

DETAILED DESCRIPTION OF THE PREFERRED EMBODIMENTS

Figure 1:
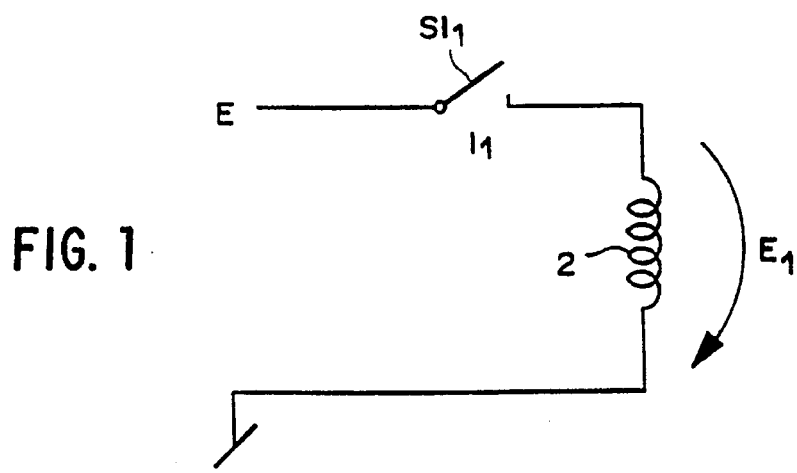
FIG. 1 is a basic diagram of the sensor according to the first preferred embodiment.

Referring now to the drawings, where the showings are for the purpose of describing preferred embodiments of the invention and not for limiting same, the operation and elements of the inductive proximity sensor will be described.

FIG. 1 is a basic diagram of the sensor according to the first preferred embodiment. One of the terminals of a coil 2 of the sensor is connected to the ground of the power supply, while the other terminal is connected to a constant voltage E across a switch $I_1$ controlled by a signal $SI_1$.

Figure 2:
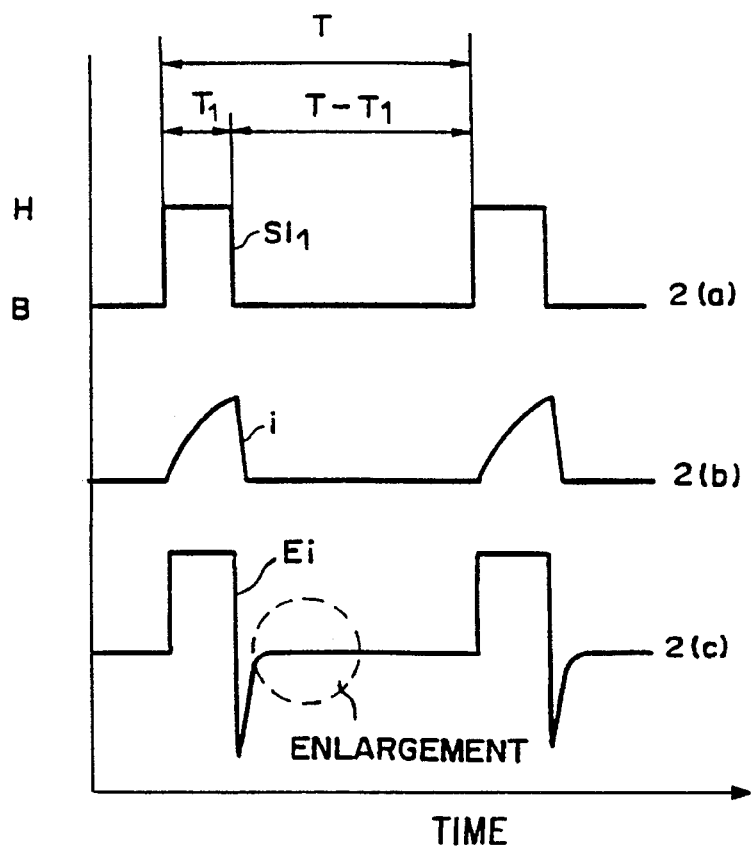
FIG. 2 is a time graph of the voltages and currents relating to the diagram of FIG. 1.

FIG. 2 is a time graph of the voltages and currents relating to the diagram of FIG. 1. Control signal $SI_1$ causes switch $I_1$, to close when it is at a high potential H and to open when it is at a low potential B. Thus switch $I_1$ is controlled periodically at a period T; it is closed during an interval $T_1$, and open during an interval $T-T_1$. A current i passing through the coil is therefore set up according to FIG. 2(b). FIG. 2(c) depicts the voltage at the terminals of the coil.

Figure 3:
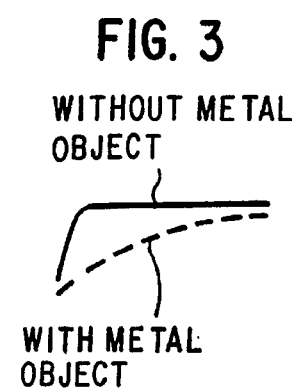
FIG. 3 is an enlarged detail of FIG. 2 pertaining to the voltage induced at the terminals of the coil of FIG. 1.

An enlargement (FIG. 3) of this voltage curve during the interval of zero current in the coil shows that the amplitude of that voltage is quite different when a metal object is situated near the sensor.

This phenomenon is explained by the fact that the variation of the current in the coil during interval $T_1$ causes induced currents in the metal object. After the forced suppression of the current in the coil through opening of switch $I_1$, the induced currents in the metal object continue to flow, inducing a voltage at the terminals of the coil. The advantage of this method of detection is the slight dependence upon the signal measured as a function of the temperature; for the voltage induced in the coil does not depend upon the resistance of the latter but only upon the intensity of the current induced in the metal object.

Figure 4:
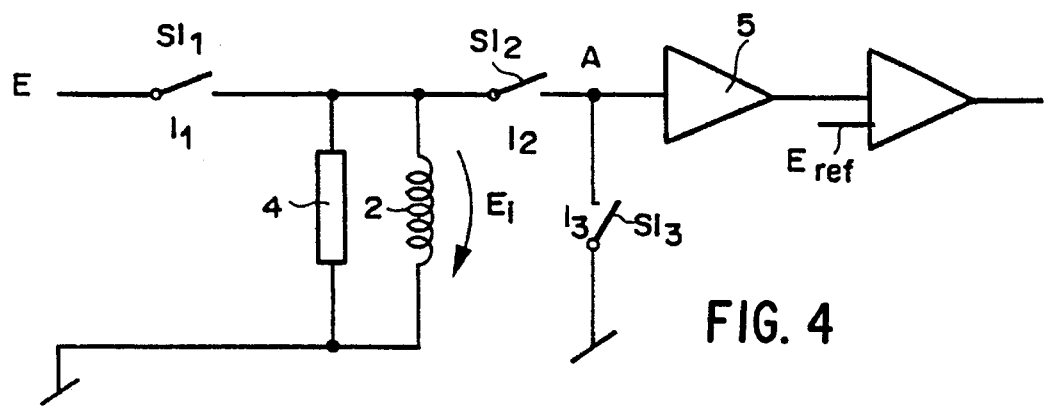
FIG. 4 is a block diagram of a sensor in a first preferred embodiment of the invention.
Figure 5:
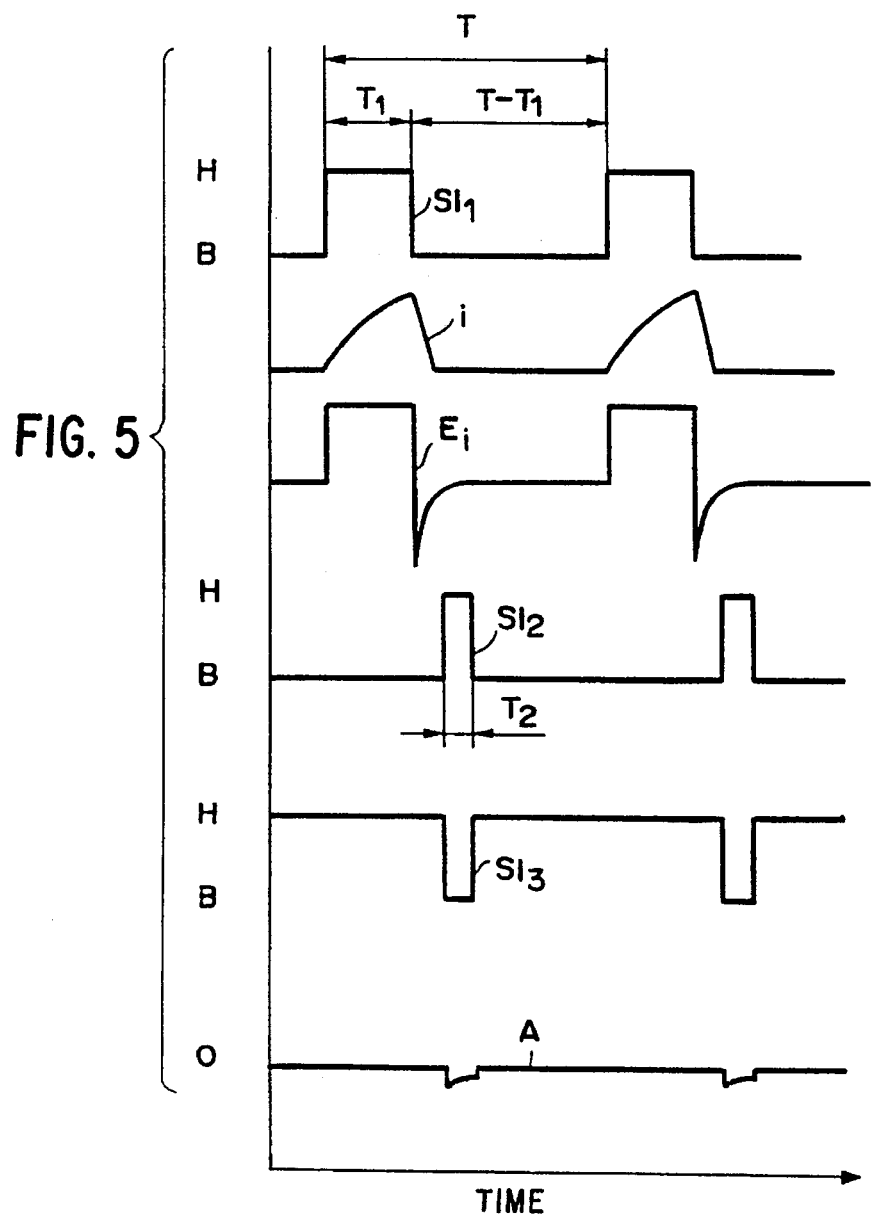
FIG. 5 is a time graph of the voltages and currents relating to the diagram of FIG. 4.

FIG. 4 is a block diagram of a sensor in a first preferred embodiment of the invention and FIG. 5 is a time graph of the voltages and currents relating to the block diagram of FIG. 4. Here coil 2 is connected in parallel with a resistor 4, the resistive value of which is about 50 times that of coil 2. The task of resistor 4 is to attenuate the oscillations due to switching. Owing to its high value, resistor 4 does not influence the measurement of the induced voltage. Controlled switches $I_2$ and $I_3$, with their control signals $SI_2$ and $SI_3$, allow measurement of the induced voltage only during interval $T_2$, when current i in coil 2 is substantially nil. The induced voltage thus processed is sent to an amplifier 5. The output voltage of amplifier 5 is compared with a reference value, whereby the proximity of a metal object can be detected.

Figure 6:
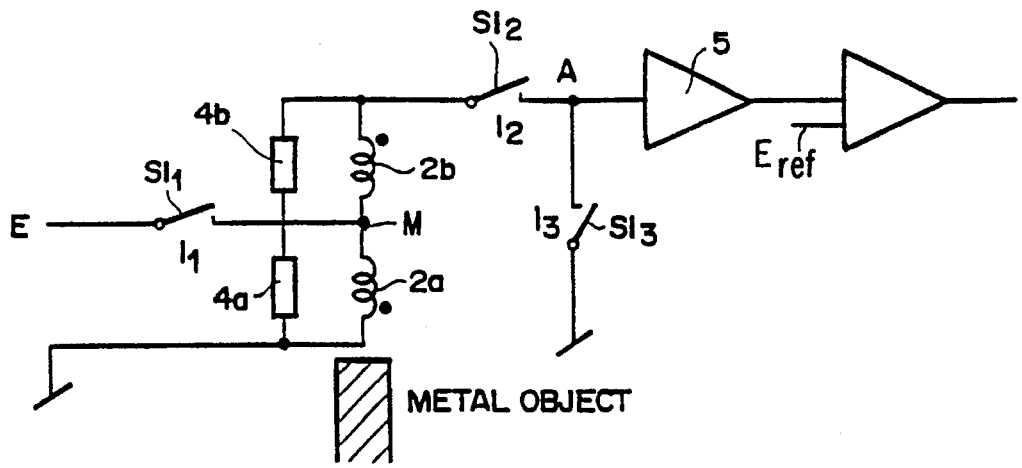
FIG. 6 is a block diagram of a second preferred embodiment of the invention.

A second preferred embodiment is shown in FIG. 6, the coil of the sensor has an intermediate output M which separates it into two parts 2a and 2b. Resistors 4a and 4b perform the same attenuating function as resistor 4 in FIG. 4. Control signals $SI_1$, $SI_2$, and $SI_3$ are identical to those in FIG. 5.

During interval $T_1$, the current flows in part 2a of the coil. The opening of switch $I_1$ brings about induced voltages in coil parts 2a and 2b. In view of the winding direction, these induced voltages have opposite phases. Part 2b, farther away from the metal object than part 2a, yields a lower induced voltage, so that the resultant induced voltage Ei is other than zero.

In the presence of a disturbing magnetic field, on the other hand, the partial induced voltages in parts 2a and 2b are practically equal but of opposite polarity, thus yielding a resultant induced voltage Ei of substantially zero. This modification makes the sensor virtually insensitive to outside disturbances.

Figure 7:
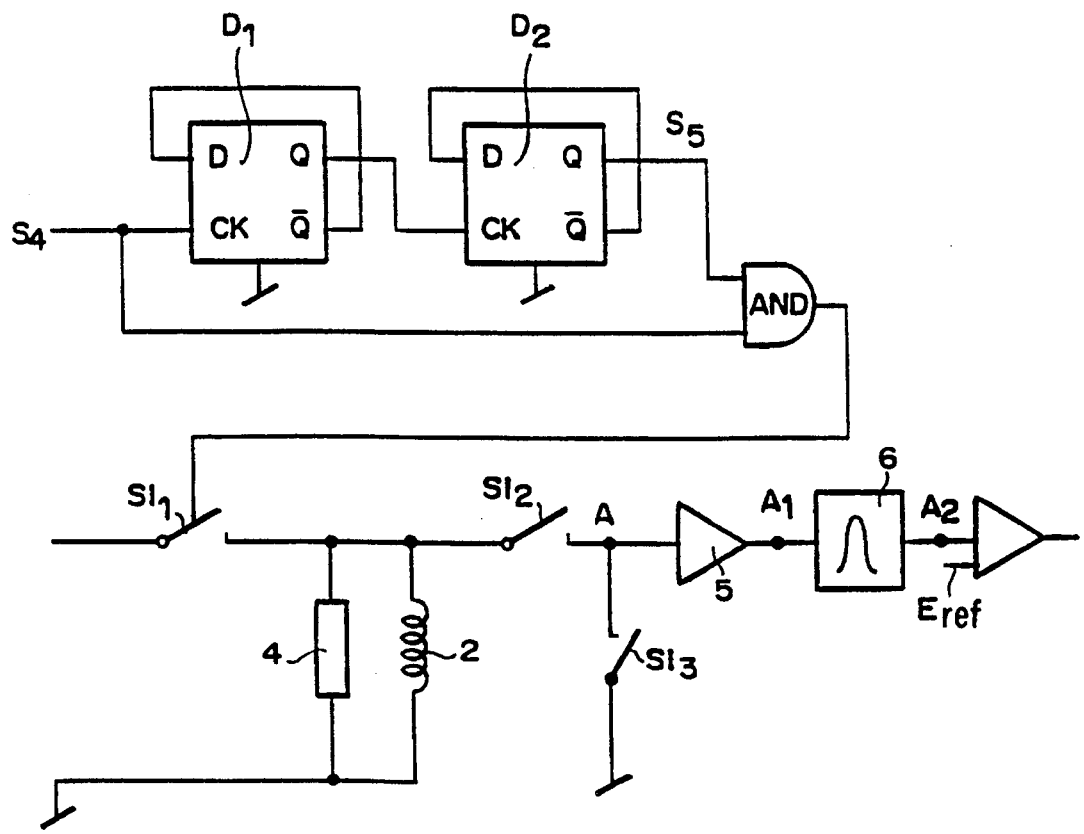
FIG. 7 is a block diagram of a third preferred embodiment of the invention.

FIG. 7 shows a third preferred embodiment of the invention. Referring to FIG. 7, control signal $SI_1$ is obtained by a combination of signals $S_4$ and $S_5$. Signal $S_4$ of a period $T_4$ is transmitted to the clock input CK of a first flip-flop $D_1$. The Q output of flip-flop $D_1$ is connected to the clock input CK of a second flip-flop $D_2$. Therefore, the output $S_5$ of the second flip-flop $D_2$ has a period T that is four times as great as $T_4$. The signals $S_4$ and $S_5$ are combined by an AND-gate to yield the control signal $SI_1$ of the sensor.

Figure 8:
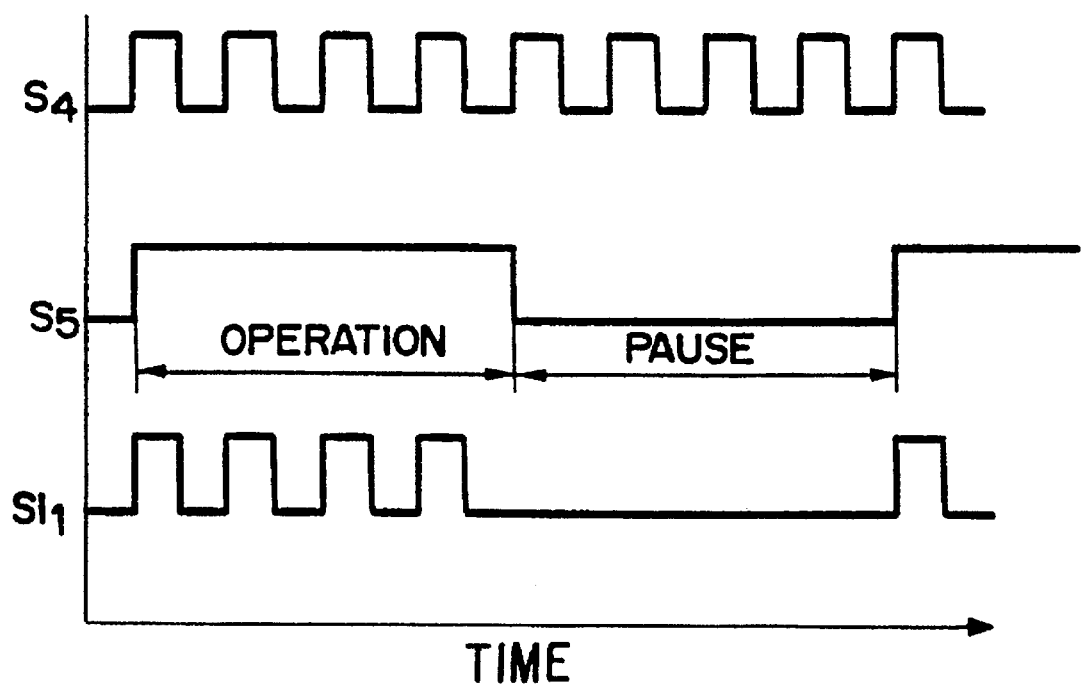
FIG. 8 is a time graph of signals $S_4$, $S_5$, and $SI_1$ relating to the third preferred embodiment of FIG. 7.
Figure 9:
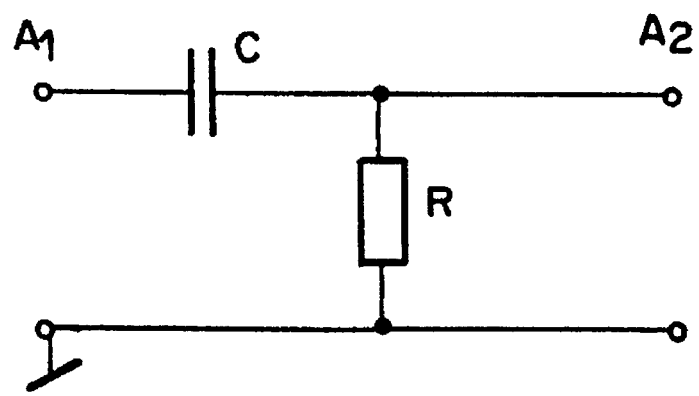
FIG. 9 is a diagram of the filter means shown in FIG. 7.

FIG. 8 is the time graph of signals $S_4$, $S_5$, and $SI_1$. In this third preferred embodiment, control signal $SI_1$ makes it possible to create a pause interval P and an operational interval S. The pause interval created has a dual advantage: first, it allows the average consumption of the sensor to be reduced; and second, it permits evaluation of the DC component (offset) introduced by amplifier 5. For eliminating the DC component introduced by amplifier 5, output $A_1$ of this amplifier is connected to a filter means 6, to generate an output signal A2. This filter means may be simply constructed with the aid of a capacitor and a resistor, as illustrated in FIG. 9.

Figure 10:
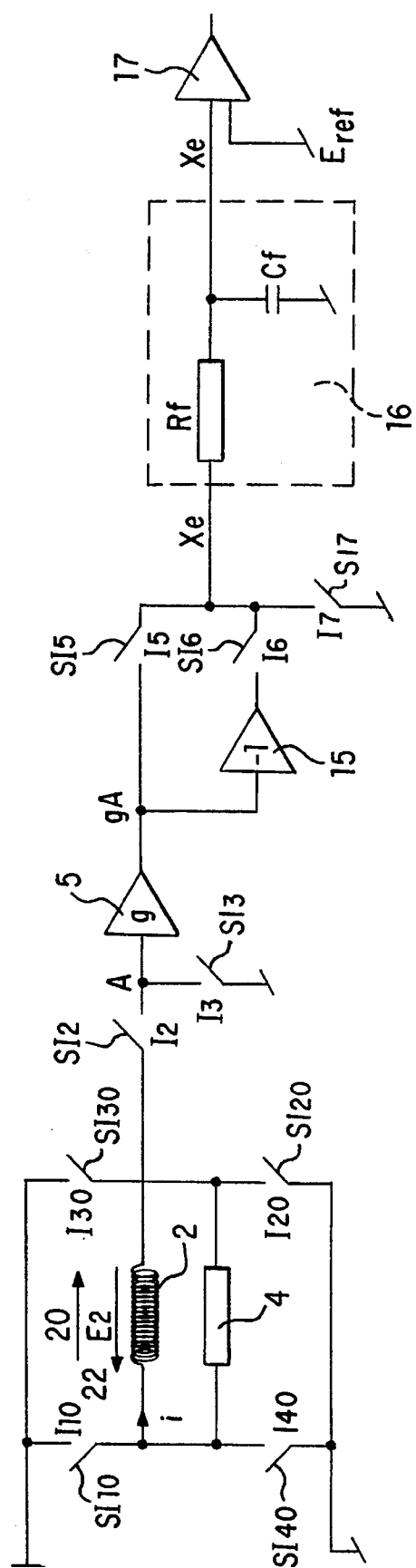
FIG. 10 is a diagram of a fourth preferred embodiment of the sensor.

FIG. 10 shows a fourth preferred embodiment of the invention. The inductive proximity sensor, which is placed near the metallic object, has four switches $I_{10}$, $I_{20}$, $I_{30}$ and $I_{40}$, controlling the current flowing through inductor 2 and resistor 4. As before, the resistive value of the resistor 4 is large, and therefore, the resistor is only used to attenuate the oscillations due to switching.

The output of the sensor is fed through switch $I_2$ to form signal A. When switch $I_3$ is open, signal A is fed into amplifier 5 to form signal gA, which is signal A amplified by gain factor g. Signal $X_e$ is formed by directly sampling the output of one of the following switches: switch $I_5$, which directly passes signal gA; or switch $I_6$, which passes the inverse of signal gA formed in amplifier 15 with a gain of −1; or switch $I_7$, which provides a grounded signal. Control of the sampling performed by signals $SI_5$, $SI_6$ and $SI_7$, which control switches $I_5$, $I_6$ and $I_7$, respectively.

A low-pass filter 16, which has resistance $R_f$ and capacitance $C_f$ filters the offset voltage in the signal $X_e$. The filtered signal $X_s$ is compared to a reference voltage $E_{ref}$ in the comparator 17. The output of the comparator indicates the presence or absence of a metallic object in the vicinity.

In this fourth preferred embodiment, the inductor 2 and the attenuating resistor 4 are used as bipolar type elements, i.e., current flows in both directions through the elements. The current paths are controlled by the four switches $I_{10}$, $I_{20}$, $I_{30}$ and $I_{40}$. When the control signals $SI_{10}$, $SI_{20}$, $SI_{30}$ and $SI_{40}$, have a high voltage (H), the switch is closed to allow current to flow. The switches are open when the control signal has a low voltage (B).

By controlling the opening and closing of the switches, a supply of bipolar power is formed. This fourth preferred embodiment has two advantages that the first preferred embodiment lacked: first, the rapid cancellation of the current by reversal of the voltage at the terminals of the inductor causes greater induced current in the target object, therefore the response obtained is greater; second, by switching off the switch $I_{30}$ when the current in the coil is practically zero, the over-voltage due to the switching off is limited.

Figure 11:
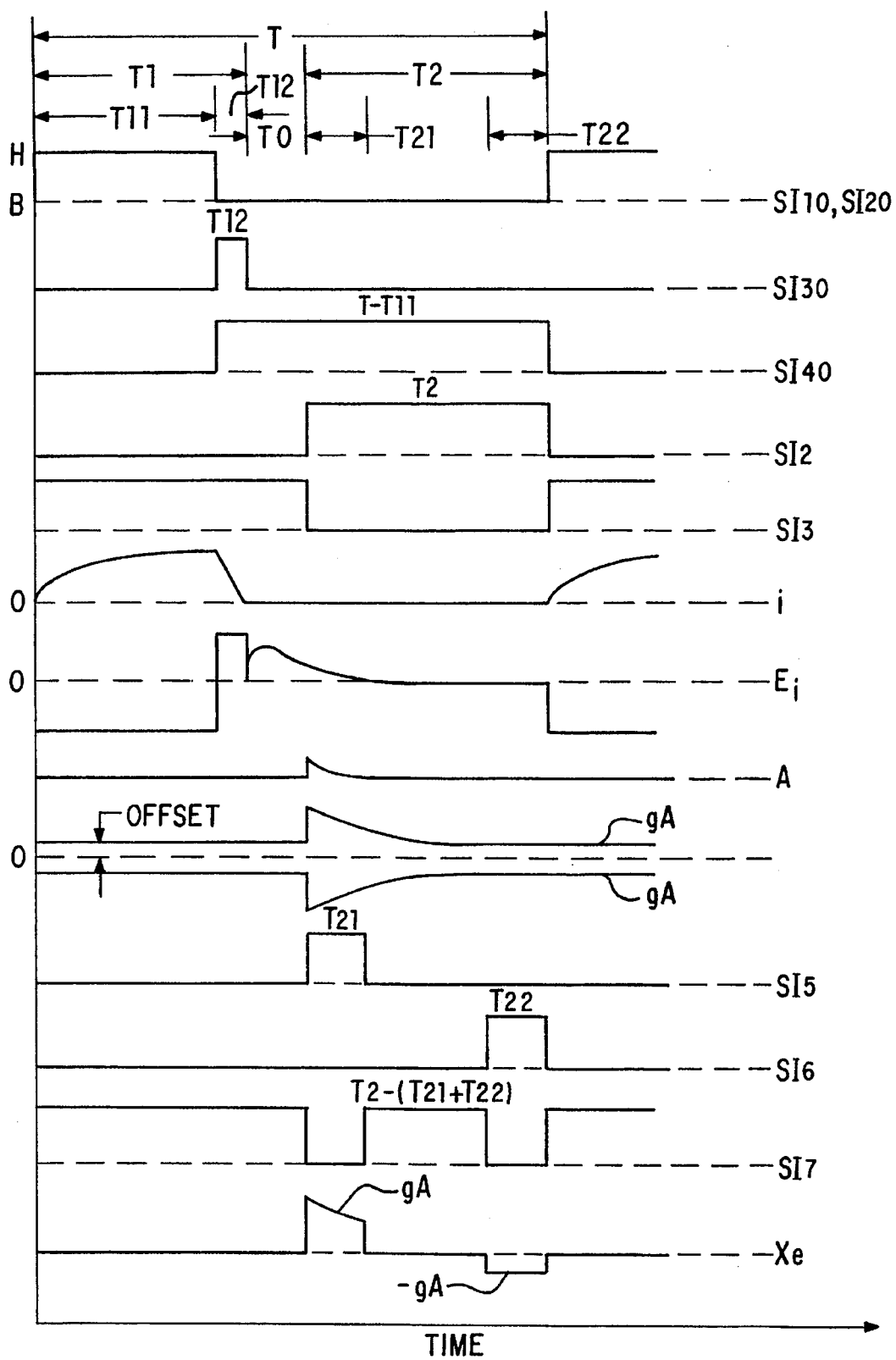
FIG. 11 is a time graph showing the voltages and currents relating to the fourth preferred embodiment.

FIG. 11 shows the timing diagram for controlling the specific switches and the output signals formed. During each cycle of period T, there are three duration periods: duration period $T_1$ for application of the power supply; a pause duration period $T_0$; and a duration period $T_2$ for measuring and processing the signals.

The first period $T_1$ is composed of two parts: period $T_{11}$ and $T_{12}$. Switch $I_2$ is open to isolate the sensing circuit from the amplification circuit. Switch $I_3$ is closed to ground the input terminal of the amplifier 5. During period $T_{11}$, switches $I_{10}$ and $I_{20}$ are closed and switches $I_{30}$ and $I_{40}$ are open. A current flows through the inductor 2 in the direction indicated by the arrow 20.

The next interval is period $T_{12}$ where switches $I_{10}$ and $I_{20}$ are open and switches $I_{30}$ and $I_{40}$ are closed. The voltage Ei across the terminals of the inductor 2 is quickly reversed, which results in a quick cancellation of the current i in the inductor. The current in the inductor 2 is practically zero after the period $T_{12}$. Switch $I_{30}$ is opened to disconnect the coil from the power supply source. As emphasized before, the rapid cancellation of the current i by reversal of the voltage Ei at the terminals of the inductor causes greater induced current in the target object.

Period $T_0$ is a pause duration to allow the voltage spike in the inductor 2 to decay. This period $T_0$ is initiated by opening switch $I_{30}$.

The measurement period $T_2$ begins with the closing of switch $I_2$ and opening switch $I_3$. The period $T_2$ is composed of two periods $T_{21}$ and $T_{22}$. The signal A is amplified by amplifier 5 with a gain g. The resulting signal is signal gA, which contains an offset voltage.

During period $T_{21}$, switch $I_5$ is closed and switch $I_7$ is opened. Switch $I_6$ remains open. The decaying voltage signal, which is amplified, in the inductor 2 forms the first part of output signal $X_e$. After period $T_{21}$ is over, switch $I_5$ is opened and switch $I_7$ is closed.

During period $T_{22}$, switch $I_6$ is closed and switch $I_7$ is opened. Switch $I_5$ remains open. The voltage signal A, which is continuing to decay and has a negative gain by passing through amplifier 15 with gain −1, forms the next part of output signal $X_e$. After period $T_{22}$ is over, switch $I_6$ is opened and switch $I_7$ is closed to supply a ground signal.

During period $T_2$, the signal $X_e$ is passed through the low-pass filter 16 to form the signal $X_s$. This final signal $X_s$ is compared to a reference voltage $E_{ref}$ in the comparator 17 to detect the presence of a metallic object.

The fourth preferred embodiment has less temperature dependence and also less sensitivity to electromagnetic disturbances than the first preferred embodiment. When the signal A at the output of the sensor is practically independent of temperature, its amplitude is relatively weak. For an elongated target, the signal A has a magnitude of some mV for a supply voltage of 5 volts. Therefore, the amplification gain g of amplifier 5 is important. As a result, signal gA at the output of the amplifier has an offset, which is not negligible with respect to the signal, that is susceptible to changing with temperature. Furthermore, signal gA has sufficiently great sensitivity to electromagnetic disturbances.

Using the two periods $T_{21}$ and $T_{22}$, the sensor allows the two aforementioned problems to be resolved at the same time. In fact, the surface of signal $X_e$ in practically independent of the offset at the output of amplifier 5:

$$X_s \cong \int_{T_{21}} (gA + \text{offset})dt - \int_{T_{22}} (gA + \text{offset})dt$$

$$X_s \cong \int_{T_{21}} (gA)dt - \int_{T_{22}} (gA)dt, \text{ if } T_{21} = T_{22}$$

The exponential variation of signal gA being given as a function of time:

$$\int_{T_{22}} (gA + \text{offset})dt \cong 0$$

$$X_s \cong \int_{T_{21}} (gA)dt$$

Figure 12:
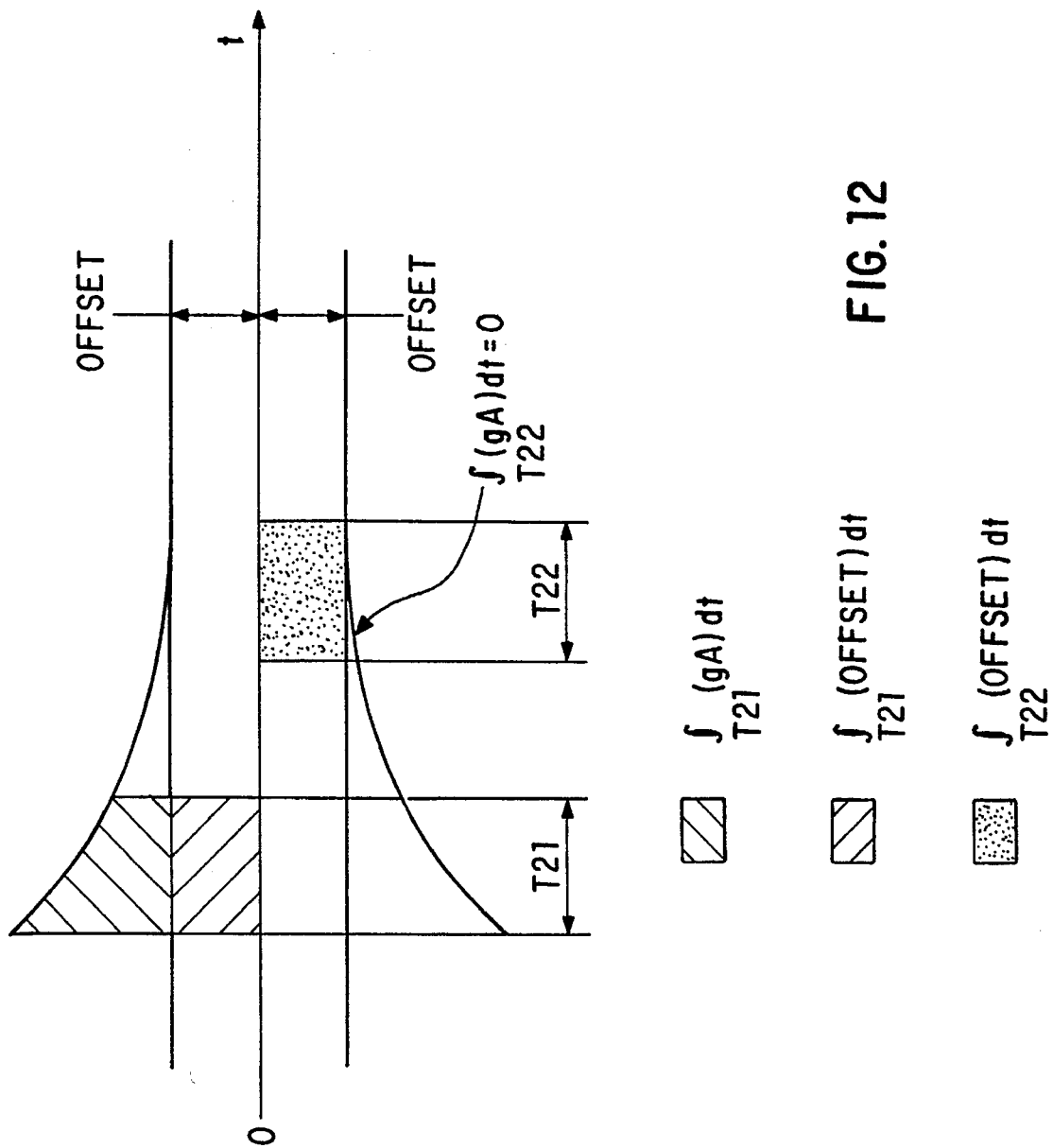
FIG. 12 is a time graph showing the integrals taken of the decaying magnetic fields in the fourth preferred embodiment.

Referring to FIG. 12, the diagram shows each of the integrals with reference to the decaying magnetic field being measured. The second integral is approximately zero due to the nearly completed decay of the magnetic field.

High frequency electromagnetic disturbances are eliminated by low-pass filter 16. The low frequency electromagnetic disturbances (50–60 Hz) cause an effect analogous to that of the offset of amplifier 5 because of the large intervals (20–16.7 ms) with respect to the distance between the periods $T_{21}$ and $T_{22}$ (25 μs). Consequently, the low frequency electromagnetic disturbances have practically no influence on the output signal $X_s$.

Although the invention has been described and illustrated with particularity, it is intended to be illustrative of preferred embodiments. It is understood that the disclosure has been made by way of example only. Numerous changes in the combination and arrangements of the parts, steps and features can be made by those skilled in the art without departing from the spirit and scope of the invention, as hereinafter claimed.

What is claimed is:

1. An inductive proximity sensor for sensing the presence of objects in close proximity to the sensor, comprising:

an inductor;

a current directing means for supplying a first voltage to the inductor to produce a current in the inductor to induce a magnetic field in the object during a first period, and for supplying a second voltage to the inductor in a direction opposite to the first voltage during a second period which begins upon conclusion of the first period and terminates upon establishing a substantially zero current in the inductor;

determining means connectable to the inductor for determining when the object is within a predetermined proximity to the inductor, the determining means measuring an induced voltage in the inductor generated by a decaying magnetic field in the object during a third period that begins shortly after the termination of the second period, and comparing the measured induced voltage with a predetermined value.

2. The inductive proximity sensor of claim 1, wherein the third period is composed of a first partial duration and a second partial duration, the measured voltage is the difference between the integral values of the induced voltage at a terminal of the inductor during the first and second partial durations.

3. The inductive proximity sensor of claim 1, wherein the third period has a first partial duration and a second partial duration, the first partial duration measuring the induced voltage that is amplified, the second partial duration measuring the induced voltage that is inverted and amplified by an inverter amplifier.

4. The inductive proximity sensor of claim 1, wherein the current directing means comprises:

a first current control means connecting a power source and a first terminal of the inductor;

a second current control means connecting the power source and a second terminal of the inductor, an output terminal being connected to the second terminal of the inductor;

a third current control means connecting said first terminal of the inductor to ground; and a fourth current control means connecting the second terminal of the inductor to ground.

5. The inductive proximity sensor of claim 4, wherein the first through fourth current control means are switches.

6. The inductive proximity sensor of claim 4, wherein the first through fourth current control means are transistors.

7. The inductive proximity sensor of claim 1, further including a resistor connected in parallel with the inductor, the resistor having a value substantially larger than the resistance of the inductor.

8. The inductive proximity sensor of claim 1, wherein the determining means comprises:

a first switching means for sampling an output of the inductor during the third period;

a first amplifier for amplifying the output of the inductor;

a second amplifier for inverting the output of the first amplifier;

a second switching means for supplying an output of the first amplifier to a comparator;

a third switching means for supplying an output of the second amplifier to the comparator; and a comparator for generating an output signal based on the output of the first and second amplifiers and a reference signal.

9. The inductive proximity sensor of claim 8, further including a low-pass filter to remove a DC offset voltage introduced by the first amplifier before comparing the output of the first and second amplifiers with the reference signal.

10. The inductive proximity sensor of claim 9, wherein the low-pass filter comprises a resistor connected between the output of the first and second amplifier and an input of the comparator, a capacitor connected between the input of the comparator to ground.

11. The inductive proximity sensor of claim 8, further including a fourth switching means for supplying a ground signal to the comparator.

12. The inductive proximity sensor of claim 11, further including a fifth switching means for supplying a ground signal to the first amplifier.

13. The inductive proximity sensor of claim 1, wherein the inductor has an intermediate output separating the inductor into two parts, a direction of inductor windings of each of the two parts being arranged to yield a resultant induced voltage equal to the sum of two partial induced voltages in phase opposition.

14. A method for sensing the presence of objects in close proximity to an inductive proximity sensor, comprising the steps of:

generating a first current in an inductor during a first period to induce a magnetic field in the object by applying a first voltage to the inductor;

applying a second voltage to the inductor in a direction opposite to the first voltage during a second period which begins upon conclusion of the first period and terminates upon establishing a substantially zero current in the inductor;

measuring an induced voltage in the inductor generated by the decaying magnetic field in the object during a third period which begins shortly after the termination of the second period to produce an intermediate signal; and comparing the intermediate signal with a reference signal to determine whether an object is in close proximity with the inductive proximity sensor.

15. The method of claim 14, wherein a plurality of switches control the direction of the current in the inductor, and an operation of the plurality of switches is controlled by a plurality of control signals.

16. The method of claim 15, wherein the switches are transistors.

17. The method of claim 14, wherein the third period is composed of a first partial duration and a second partial duration, the measured voltage is the difference between the integral values of the induced voltage at the terminal of the inductor during the first and second partial durations.

18. The method of claim 14, wherein the third period has a first partial duration and a second partial duration, the measured induced voltage being amplified by an inverter amplifier during the first partial duration and the measured induced voltage being inverted and amplified during the second partial duration.

19. The method of claim 14, further including the step of removing a DC offset voltage using a low-pass filter before said comparing step.

20. The inductive proximity sensor of claim 1, wherein the current directing means is disconnected from the inductor between the second and third period.

* * * * *